United States Patent [19]

Takahashi et al.

[11] 3,870,971

[45] Mar. 11, 1975

[54] CIRCUIT ARRANGEMENT OF VOLTAGE CONTROLLED OSCILLATOR

[75] Inventors: Nobuaki Takahashi, Yamato; Masao Kasuga, Sagamihara, both of Japan

[73] Assignee: Victor Company of Japan, Ltd., Yokohama City, Kanagawa-ken, Japan

[22] Filed: Mar. 15, 1974

[21] Appl. No.: 451,468

[30] Foreign Application Priority Data

Mar. 17, 1973 Japan .............................. 48-31144
Mar. 23, 1973 Japan .............................. 48-35317

[52] U.S. Cl. .............................. 331/108 D, 331/111
[51] Int. Cl. .............................. H03k 3/282
[58] Field of Search ........... 331/8, 111, 108 D, 143, 331/113

[56] References Cited

UNITED STATES PATENTS 3,582,809 6/1971 Rigby .............................. 331/8
3,811,097 5/1974 Jijkmans .............................. 331/113
3,815,052 6/1974 Watatani .............................. 331/108

*Primary Examiner*—John Kominski

[57] ABSTRACT

The circuit of a voltage controlled oscillator comprises a voltage controlled oscillation circuit part, first and second constant-current circuits for causing the flow of respective constant currents, and current dividing means for dividing the current of the first constant-current circuit in accordance with an outside control voltage, the oscillation frequency of the voltage controlled oscillation circuit part is controlled by an input control current equal to the sum of one divided current of the current dividing means and the constant current of the second constant-current circuit.

7 Claims, 5 Drawing Figures

CIRCUIT ARRANGEMENT OF VOLTAGE CONTROLLED OSCILLATOR

BACKGROUND OF THE INVENTION

This invention relates to a circuit arrangement of a voltage controlled oscillator and more particularly to an improvement of a voltage controlled oscillator, or a circuit organization for constituting this voltage controlled oscillator, for supplying the oscillation output signal to a phase comparator in a phase locked loop employed for uses such as demodulation of angle-modulated waves.

In general, a voltage controlled oscillator (hereinafter referred to as a VCO) for use in a phase locked loop (hereinafter referred to as a PLL) is required to possess desirable properties such as a linear relationship between the control voltage applied from the outside and the output oscillation frequency and equal duty cycles of the output oscillation waveform.

Furthermore, in the case where a VCO is to be incorporated in a monolithic integrated circuit (IC), the VCO is required to have characteristics such as an oscillation output voltage which is not extremely high and an oscillation output waveform which does not contain a large quantity of harmonic components, that is, which is not a sharp-cornered rectangular waveform but a waveform with rounded-off corners, in order to prevent the oscillation output of the VCO from imposing interference on other circuits within the same IC chip.

A further requirement in the case where the VCO is to be incorporated in a monolithic IC is that the value of the consumed current of the +B power source applied to the VCO be unvarying with respect to the oscillation output in order to prevent the oscillation current of the VCO from imparting an effect on other circuits via the power supply circuit.

Accordingly, the applicant has previously proposed a novel voltage controlled oscillator and the circuit arrangement thereof which satisfy the above stated requirements, as described hereinafter, in the U.S. Pat. application, Ser. No. 417,475, filed on Nov. 19, 1973, and entitled "Circuit arrangement of voltage controlled oscillator."

On one hand, the applicant has also invented a so-called discrete four-channel record disc, which invention has been granted U.S. Pat. No. 3,686,471 and is at present being widely practiced. In the process of recording on this disc, a direct wave of a sum signal of two of the channels and an angle modulated wave obtained by angle modulating a carrier wave of 30 KHz by means of a difference signal of two of the channels are multiplexed and recorded on the left and right wall surfaces of the disc sound groove. For the demodulation of the angle modulated wave within the reproduced signal of this four-channel record disc, a PLL circuit is generally used.

The operational result of placing a reproducing (playing) pickup stylus on a discrete four-channel record disc at rest and then starting the rotation of the record disc from this state will now be considered. In this case, the record disc starts rotating from its stopped state and gradually increases its rotational speed until, after a specific time, it reaches a constant rotational speed. Since the pickup stylus is riding on the record disc during this period of slow speed from the stopped state of the disc to the time when it reaches the constant speed, a previously recorded signal is being reproduced during this period.

This reproduced signal is at a lower frequency than the normal frequency. Consequently, erroneous locking with respect also to a signal of a frequency of the order of fraction of the carrier wave frequency, for example, tends to occur in the PLL circuit. This mislocking at this time causes noise.

Accordingly, the generation of this noise can be prevented by previously preventing the oscillation frequency of the voltage controlled oscillator from decreasing to a value below a certain critical frequency so that, after the rotational speed of the disc becomes close to the normal value, the phase of the oscillation signal of the voltage controlled oscillator is locked to the phase of the input angle modulated signal.

The above mentioned, previously proposed voltage controlled oscillator is so adapted that the oscillation frequency will not become less than a certain critical frequency. However, for reasons such as deviations in the current amplification factors of the transistors used and in the resistance values of the resistors used, the maintaining of this critical oscillation frequency at a specific constant value has been a difficult problem.

SUMMARY OF THE INVENTION

Accordingly, it is a general object of the present invention to provide a circuit arrangement of a novel and useful voltage controlled oscillator in which circuits are further added to the above mentioned previously proposed voltage controlled oscillator, and in which the above mentioned problem has been solved.

Another object of the invention is to provide a circuit arrangement of a voltage controlled oscillator in which the critical value of the oscillation frequency is accurately and positively held continually at a specific frequency. By this provision in the circuit arrangement of the invention, when it is used in the PLL circuit serving as a demodulation circuit of a discrete four-channel reproducing apparatus, for example, there is no possibility, even when the rotation of the record disc is started with the pickup stylus resting on the record, of the PLL circuit erroneously locking to an angle modulated wave signal reproduced as of frequencies lower than the normal frequency in the period before the record disc attains its normal constant rotational speed thereby to generate noise.

A further object of the invention is to provide a circuit arrangement of a voltage controlled oscillator in which a control current and the oscillation frequency have a linearly proportional relationship, and, moreover, the oscillation frequency is controlled with the current which varies within a predetermined range with a specific current as a center.

Other objects and further features of the invention will be apparent from the following detailed description with respect to the preferred embodiments of the invention when read in conjunction with the accompanying drawings.

DETAILED DESCRIPTION

Figure 1:
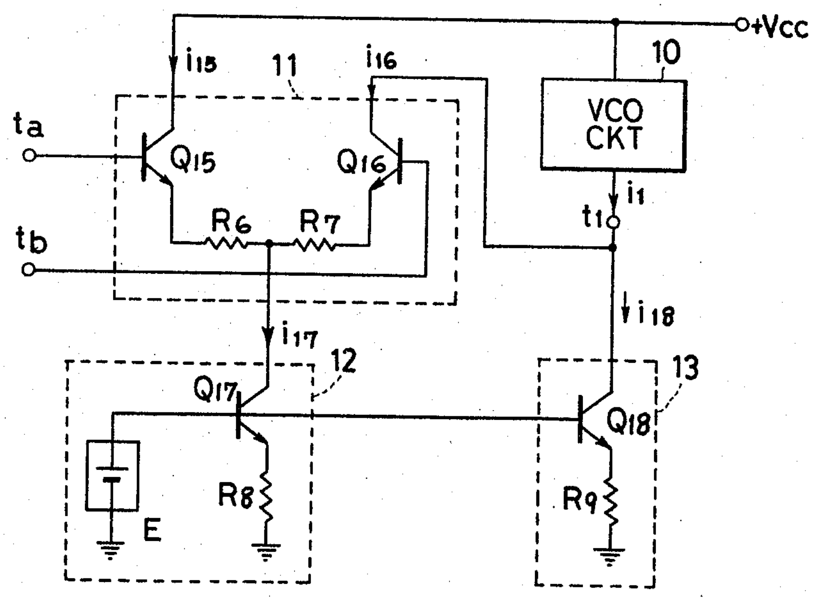
FIG. 1 is a circuit diagram showing one embodiment of circuit arrangement of a voltage controlled oscillator according to the invention.
Figure 2:
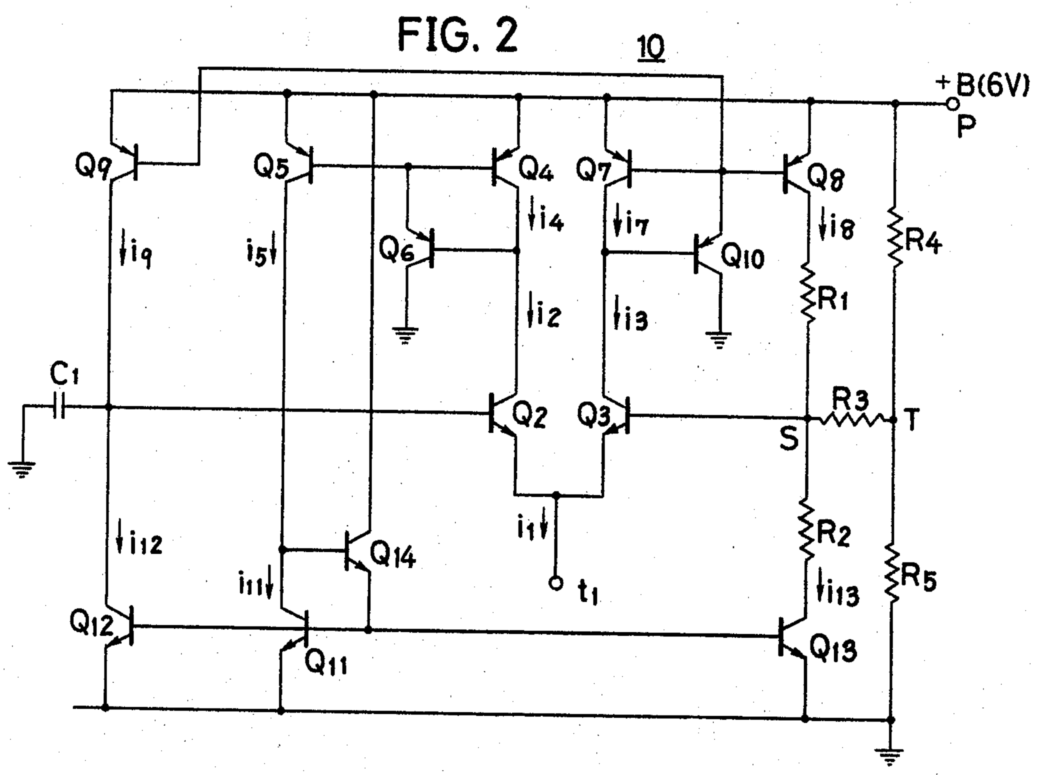
FIG. 2 is a circuit diagram of one example of a voltage controlled oscillator circuit part in the arrangement illustrated in FIG. 1.

In FIG. 1, a voltage controlled oscillator circuit part 10 is that the applicant has previously proposed, one example of specific circuit organization of which is shown in FIG. 2.

The voltage controlled oscillator circuit part 10 is described with reference to FIG. 2 at first.

The emitters of transistors Q2 and Q3 are connected commonly to each other and to a control terminal $t1$. A capacitor C1 is connected between the base of the transistor Q2 and ground. In the case where this VCO circuit is to be incorporated in a monolithic IC together with other circuits, this capacitor C1 is connected outside of the IC.

The circuit of this circuit further has transistors Q4, Q5, and Q6 constituting a current-mirror circuit. In addition, there are provided transistors Q7, Q8, Q9, and Q10 and transistors Q11, Q12, Q13, and Q14 respectively constituting modifications of the current-mirror circiut. Here, the base, emitter, and collector of the transistor Q9 are connected respectively to the bases of the transistors Q7 and Q8, to a regulated power source terminal P, and to the capacitor C1. Furthermore, the base, emitter, and collector of the transistor Q12 are connected respectively to the bases of the transistors Q11 and Q13, to ground, and to the capacitor C1. In these modified current-mirror circuits, the collector currents are respectively equal among the transistors Q7, and Q8, and Q9 and transistors Q11, Q12, and Q13.

The collectors of the transistors Q8 and Q13 are respectively connected by way of resistors R1 and R2 of relatively high resistance values to a junction point S, to which the base of the transistor Q3 is also connected. Between the power source terminal P and ground, resistors R4 and R5 are connected in series, and between the junction point T between these resistors R4 and R5 and the junction point S, a resistor R3 is connected.

As a consequence of the flow of the current i1 to the terminal $t1$, between the transistors Q2 and Q3, the transistor of higher base potential is rendered "ON", while that transistor of lower base potential is rendered "OFF".

If the transistor Q2 thus becomes ON, the current $i1$ of the terminal $t1$, the collector currents $i2$ and $i3$ of the transistors Q2 and Q3 will have the following relationships.

$$i1 = i2,\ i3 = 0$$

Furthermore, as a result of the operation of the current-mirror circuits, the following relationships will be valid between the collector currents $i4$, $i5$, $i11$, $i12$, and $i13$ of the transistors Q4, Q5, Q11, Q12, and Q13.

$$i4\ (= i2) = i5,$$

and $$i11\ (= i5) = i12 = i13$$

Accordingly, $$i1 = i2 = i4 = i5 = i11 = i12 = i13.$$

On the other hand, the currents $i3$, $i7$, $i8$, and $i9$ of the transistors Q3, Q7, Q8, and Q9 will all be equal to zero.

Therefore, when the transistor Q2 is ON, and the transistor Q3 is OFF, a discharge current $i12$ flows from the capacitor C1, and the current $i1$ flows to the terminal $t1$.

Conversely, when the transistor Q2 is OFF, and the transistor Q3 is ON, $$i1 = i3 = i7 = i9,$$

and $$i2 = i5 = i12 = 0$$

Therefore, in this case, a charging current $i9$ flows to the capacitor C1.

As a result, a discharging current $i12$ ($= i1$) and a charging current $i9$ ($=i1$) flow alternately in the capacitor C1 in accordance with the alternate ON and OFF states of the transistors Q2 and Q3.

The potential of the point S connected to the base of the transistor Q3 will be considered. For this purpose, it will be assumed that the resistance values of the above mentioned resistors R1 through R5 have been selected as follows.

$$R1 = R2 = 25\ K\Omega,\ R3 = 5\ K\Omega,$$

$$R4 = R5 = 1.5\ K\Omega$$

The potential of the junction point T is the result of potential division of the potential of +B (6V) by the resistors R4 and R5 (where, R4 = R5), that is, is one-half of 6V or 3V.

Then, when the transistor Q2 is ON, and the transistor Q3 is OFF, the current-mirror circuit of the transistors Q11, Q12, and Q13 tends to cause the flow of currents $i11 = i13 = i1$. However, since the potential at the point T is 3V even in the case where $i1 = 200\ \mu A$, 200 $\mu A$ does not flow as the current $i13$. Instead a current $i13$ of the following value flows.

$$i13 = 3/[(25 + 5) \times 10^3] = 100\ (\mu A)$$

Since the current flows from the point T toward the point S at this time, the potential at the point S becomes $$3 - (5 \times 10^3 \times 100 \times 10^{-6}) = 2.5\ V.$$

Therefore, even if the current $i1$ is higher than 100 $\mu A$, the potential of the point S will become constant. At this time $i8 = 0$.

Similarly, when the transistor Q3 is ON, the current $i13$ is zero, and the current $i8$ becomes 100 $\mu A$. Then since the current flows from the point S toward the point T, the potential of the point S becomes $3 + (5 \times 10^3 \times 100 \times 10^{-6}) = 3.5$ V.

Thus, when the transistor Q3 is OFF, its base potential becomes 2.5 V, whereas when it is ON, its base potential becomes 3.5 V. Furthermore, as mentioned above, a discharging current of $i12 = i1$ flows from the capacitor C1 when the transistor Q3 is OFF, while a charging current of $i9 = i1$ flows thereto when the transistor Q3 is ON.

Figure 3:
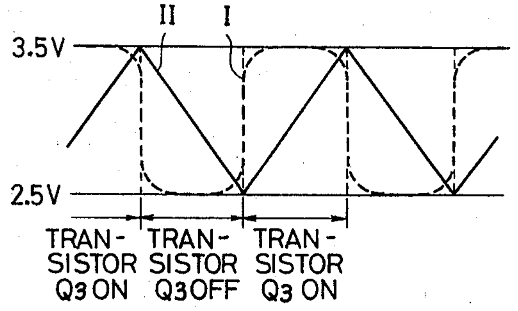
FIG. 3 is a graph indicating the waveform of the base voltage of a transistor for a description of the manner in which the voltage controlled oscillation shown in FIG. 2 oscillates.

This operational feature is indicated in FIG. 3. In this figure, the rectangular wave shown by the broken line I represents the base potentials of the transistor Q3 resulting from the ON and OFF states of the transistor Q3, that is, the variation of the potential at the point S. This potential is indicated as being 3.5V when the transistor Q3 is ON and 2.5V when the transistor Q3 is OFF.

Then, as mentioned above, a charging current of $i9 = i1$ flows in the capacitor C1 when the transistor Q3 is ON. At this time, the potential at the junction point between the base of the transistor Q2 and the capacitor C1 rises with a gradient determined by the current $i9$ $= i1$) and the capacitance of the capacitor C1. Then, when the base potential of the transistor Q2 rises in this manner and reaches a value higher than 3.5V, the transistor Q2 becomes ON, while the transistor Q3 becomes OFF.

As a result of the OFF state of the transistor Q3, its base potential becomes 2.5V, and a discharging current $i12 = i1$ flows from the capacitor C1. As a result, the base potential of the transistor Q2 decreases gradually with a gradient which the reverse of that of the above mentioned rise. Then, when this base potential of the transistor Q2 becomes less than 2.5V, the transistor Q2 becomes OFF, and the transistor Q3 becomes ON, whereby the state of the circuit is inverted.

The above described variations of the base potential of the transistor Q2 is indicated by full line II in FIG. 3. Since, the charging and discharging currents $i9$ and $i12$ are equal in this case, the duty cycles of the ON and OFF states of the transistors Q2 and Q3 are equal, whereby these duty cycles are one-half, that is, 50 percent.

Thus, the VCO continues its oscillation by producing an oscillation output of a duty cycle of 50 percent. The oscillation frequency of this oscillation is determined by the current $i1$ ($= i9 = i12$) and the capacitance of the capacitor C1. Here, the current $i1$ and the oscillation frequency have a linear, proportional relationship.

The collector currents of the transistors Q8 and Q13 flow through the resistors R1 and R2 of high resistance value of 25 KΩ, and, furthermore, there are capacitance components between the base and emitter and between the base and collector of the transistor Q3. For this reason, the response speed of the variation of the base voltage of the transistor Q3 becomes slow, and the waveform of this base voltage becomes a rectangular wave with dull, rounded corners between its rising part and its falling part as indicated by the broken line I in FIG. 3.

In this connection, the fact that the corners of a rectangular wave are sharp means that it contains many harmonic components, whereas roundness of the corners of a rectangular wave means that an oscillation output with few harmonic components can be obtained as the output of the VCO.

The oscillation output of the VCO itself is led out through the points S and T and supplied to a phase comparator (not shown) of the PLL.

The oscillation output voltage within the voltage controlled oscillaltor circuit is held at the sum of the forward diode voltages (0.7V) between the bases and emitters of two silicon transistors (e.g., Q4 and Q6), that is, at a value of 1.4 V*p—p* as a masimum. Therefore, when the above described circuit is incorporated within a monolithic IC together with another circuit, its oscillation output does not have a deleterious effect on the other circuit. Furthermore, the variation in the consumed current from the +B power source to the VCO is of the order of less than 50 μA, for example, which is very small.

When the current corresponding to an oscillation frequency of 30 KHz is 200 μA, the values of the above mentioned collector currents $i8$ and $i13$ are determined by the lower limiting frequency of the above mentioned lock range characteristic. For example, in the case where the limiting frequency of the lock range is 15 KHz, the currents $i8$ and $i13$ are selected at 100 μA.

Returning to the circuit illustrated in FIG. 1, the circuit arrangement of the voltage controlled oscillator according to the invention is characterized in that it is constituted by the addition of a differential amplifier circuit 11 and constant current circuits 12 and 13 to the above described voltage controlled oscillator circuit part 10.

The differential amplifier 11 comprises a pair of transistors Q15 and Q16 of which emitters are connected together through resistors R6 and R7. To the bases of these transistors Q15 and Q16 are connected terminals *ta* and *tb*, to which external control voltages are applied. The collector of the transistor Q15 is connected to a +V*cc* terminal, while the collector of the transistor Q16 is connected to a terminal *t*1 of the above mentioned voltage controlled oscillator circuit part 10. This differential amplifier 11 is driven by the first constant-current circuit 12.

This first constant-current circuit 12 comprises a transistor Q17 of which collector is connected to a junction point between the resistors R6 and R7, and of which emitter is grounded through a resistor R8, and a bias power supply E connected to the base of the transistor Q17.

The second constant-current circuit 13 comprises a transistor Q18 of which base is connected to the bias power supply E, and of which emitter is grounded through a resistor R9. The collector of this transistor Q18 is connected to the above mentioned terminal *t*1 of the voltage controlled oscillator circuit part 10.

In the above described circuit organization, the collector current $i17$ of the transistor Q17 of the first constant-current circuit 12 can be expressed by the following equation.

$$i17 = (1 - V_{BE17}/r8) \tag{1}$$

where:

$V_{BE17}$ is the forward direction voltage between the base and emitter of the transistor Q17; the voltage of the bias power supply E is 1V; and $r8$ is the resistance value of the resistor R8.

When the current amplification factor $H_{fe}$ of the transistors Q15 and Q16 is assumed to be amply large, and the base currents thereof are assumed to be negligibly small, the relationship $i17 = i15 + i16$ (where $i15$ and $i16$ denote the collector currents of the transistors Q15 and Q16) is obtained. Furthermore, when the resistance values $r6$ and $r7$ of the resistors R6 and R7 are selected to be equal ($r6 = r7$), and when the control voltage impressed across the terminals *ta* and *tb* is zero, the relationship $i15 = i16$ is obtained, and $i16 = i17/2$.

When the potential of the terminal ta becomes higher than that of the terminal *tb*, the collector current *i*15 of the transistor Q15 increases accordingly, while the collector current *i*16 of the transistor Q16 decreases. Conversely, when the potential of the terminal *ta* becomes lower than that of the terminal *tb*, the currents *i*15 and *i*16 accordingly decrease and increase, respectively. The collector current *i*16 of the transistor Q16 thus varies in accordance with the control voltage in the range of from zero to *i*17. Therefore, this collector *i*16 can be expressed by the following equation.

$$i16 = (i17/2) \pm (i17/2) \quad (2)$$

On one hand, the collector current *i*18 of the transistor Q18 constituting the constant current circuit 13 can be expressed by the following equation in terms of the resistance value *r*9 of the resistor R9 and forward direction voltage $V_{BE18}$ between the base and emitter of the transistor Q18.

$$i18 = (b - V_{BE18}/r9) = (r8/r9) \cdot i17 \quad (3)$$

Therefore, the control current *i*1 of the voltage controlled oscillator circuit part 10 is as follows:

$$i1 = i16 + i18.$$

Therefore, $$i = (r8/r9) \cdot i17 + (i17/2) \quad (4)$$

Figure 4:
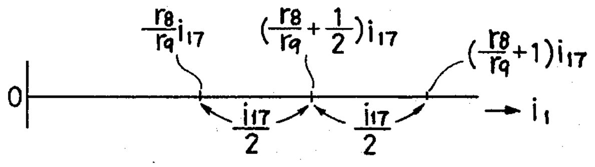
FIG. 4 is a diagram indicating current ranges for a description of the circuit arrangement of the invention.

FIG. 4 indicates the range of variation of the above expressed control current *i*1. As is apparent from this diagram, the voltage controlled oscillator circuit part 10 is controlled by a current which varies in a range of $\pm i17/2$ with a current of $((r8/r9) + ½ ) \cdot i17$ as a center.

Accordingly, the oscillation frequency of the oscillator circuit part 10 is limited within a range ($f0 \pm f1$), where $f0$ is the oscillation frequency of the voltage controlled oscillator circuit part 10 corresponding to a current of $( (r8/r9 + ½ ) \cdot i17$, and $f1$ is the oscillation frequency of the voltage controlled oscillator circuit part 10 corresponding to a current of *i*17/2. The oscillation frequency of the voltage controlled oscillator circuit part 10 thus limited cannot become higher than the frequency ($f0 + f1$) and cannot become lower than the frequency ($f0 - f1$).

Then, in the case where the voltage controlled oscillator of the above described organization is used in a phase-locked loop (PLL), this PLL does not operate with respect to an input signal of a frequency lower than the frequency ($f0 - f1$) and higher than the frequency ($f0 + f1$). For this reason, when these frequencies are so set that $f0$ = 30 KHz and $f1$ = 15 KHz, for example, the PLL acquires a lock range of (30 ± 15) KHz.

When, in the discrete system multichannel record disc reproducing apparatus, for example, the rotation of the record disc is started from a state wherein the pickup is resting on the stopped record disc, a frequency of, for example, 1/5 or 6 KHz, or 1/3 or 10 KHz, of the carrier wave frequency of 30 KHz of the angle modulated wave in the multiplexed signal recorded on the record is reproduced in the time period until the disc rotational speed reaches the constant normal speed. In the case of a conventional PLL, there would be the possibility of erroneous locking to these frequencies and the resulting generation of noise.

In a PLL in which the voltage controlled oscillator according to this invention is incorporated, however, the lock range is set at (30 ± 15) KHz as described above, whereby there is no possibility of this erroneous locking of the PLL to frequency components such as the above mentioned 6 KHz and 10 KHz. Therefore, noise is not generated.

Thus, in the voltage controlled oscillator according to the present invention, the control current and the oscillation frequency have a linearly proportional relationship, and this oscillation frequency is controlled by the control current which varies within a specific range having a center at a specific current. Accordingly, the critical value of the oscillation frequency can be held accurately and positively at a specific frequency value.

A second embodiment of the invention which is an improvement of the circuit of the preceding embodiment will now be described with reference to FIG. 5.

Values such as the capacitance value of the capacitor C1, the resistance value of the resistors in the circuit, and the parameters of the transistors of the part of the voltage controlled oscillator circuit part 10 shown in FIG. 2 deviate, in actual practice, from their respective design values. For this reason, there are some cases wherein the oscillation center frequency $f0$ of the circuit becomes different from the design value (for example, 30 KHz). Accordingly, it is desirable that, even when there are deviations in the oscillation frequencies of voltage controlled oscillators coming off the production line in actual practice, the deviated oscillation frequencies be adjustable to their predetermined values.

One conceivable measure for realizing this adjustability is the provision of an arrangement wherein, for example, the values of output currents *i*17 and *i*18 of constant-current circuits 12 and 13 can be varied at will. In this case, it is possible to vary the value of the current *i*1 with the external control signal impressed across terminals *ta* and *tb* in zero state, whereby the center frequency $f0$ of the voltage controlled oscillation circuit part 10 can be adjusted as desired.

Then, in order to obtain the above described arrangement, it is necessary to provide in the IC a separate auxiliary control terminal for adjustment of the current *i*1 in addition to the terminals *ta* and *tb*. However, in an IC of limited number of pins, an arrangement of this character is unsuitable.

Another conceivable measure for compensating for deviations of the above mentioned oscillation frequency $f0$ is the application beforehand of a constant DC potential across the terminals *ta* and *tb*. In this case, however, the relationship of $i15 = i16 = ½\ i17$ cannot be maintained with the external control signal in zero state, and in order to obtain a current *i*1 corresponding to the center frequency $f0$, the current *i*16 must be selected at a value offset from *i*17/2.

Therefore, in the case where the voltage controlled oscillator is combined in a phase-locked loop (PLL) used as a demodulation circuit in a discrete multichannel disc reproducing apparatus, the lock range of this PLL becomes asymmetrical by the amount of the offset from *i*17/2. For this reason, maintenance of high fidelity when reproduction and demodulation of the above mentioned disc is carried out becomes difficult.

Figure 5:
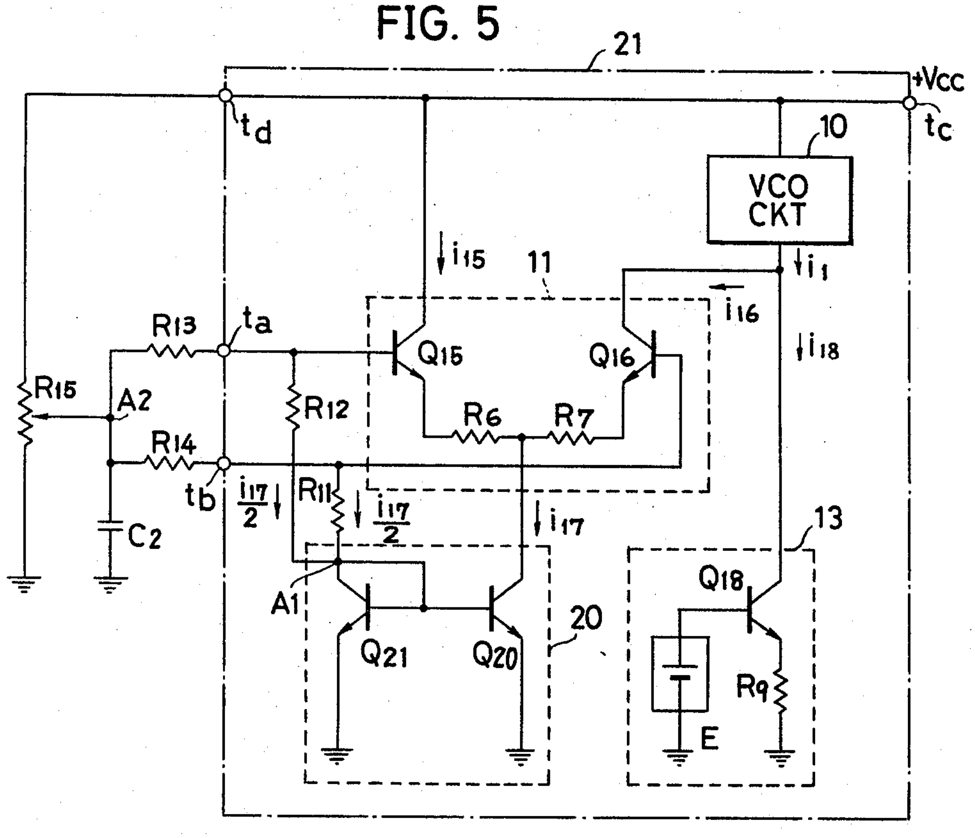
FIG. 5 is a circuit diagram showing another embodiment of the circuit arrangement of a voltage controlled oscillator according to the invention.

This problem has been solved by the circuit arrangement of the instant embodiment as illustrated in FIG. 5. In FIG. 5, parts which are the same as corresponding parts in FIG. 1 are designated by like reference numerals and characters and will not be described in detail again.

A current mirror circuit 20 comprises transistors Q20 and Q21 having grounded emitters. The collector of the transistor Q20 is connected to a junction point between the resistors R6 and R7. The collector of the transistor Q20 is connected by way of a resistor R11 to terminal *tb*. The bases of the transistors Q20 and Q21 are connected commonly to the collector of the transistor Q21 and, at the same time, by way of a resistor R12 to the terminal *ta*.

A circuit part 21 indicated by the single-dot chain line enclosure and containing the voltage controlled oscillator circuit part 10, differential amplifier circuit 11, constant current circuit 13, current mirror circuit 20, resistors R11 and R12, etc., is integrated in an IC. This IC 21 is provided with pins for the above mentioned terminals *ta* and *tb* and +Vcc terminals *tc* and *td*.

To the terminals ta and tb are respectively connected to the ends on one side of resistors R13 and R14, the other ends of which are connected to the slidable contact of a variable resistor R15 and, at the same time, are grounded by way of a capacitor C2. The variable resistor R15 is connected between the terminal td and ground.

The above mentioned resistors R13 and R14, the variable resistor R15, and capacitor C2 are connected outside of the IC 21.

In the circuit of the above described organization, the resistors R11, R12, R13, and R14 constitute a bridge circuit. Accordingly, when the resistance values *r*11 through *r*14 of these resistors R11 through R14 are so selected that *r*11 = *r*12 and *r*13 = *r*14, the bridge circuit assumes a state of equilibrium, and the potential difference between the terminals *ta* and *tb* will not vary even if the voltage between the junction point A1 between the resistors R11 and R12 and the junction point A2 between the resistors R13 and R14 is caused to vary. Conversely, a variation in the voltage between the terminals *ta* and *tb* will not cause a variation in the potential difference between the junction points A1 and A2.

Then, with the circuit in a state wherein the frequency control signal applied across the terminals *ta* and *tb* is zero, that is, a state wherein the collector currents *i*15 and *i*16 of the transistors Q15 and Q16 have the relationship *i*15 = *i*16 = *i*17/2, the value of the variable resistor R15 is varied. Then, since the voltage between the points A1 and A2 varies, it is possible to vary the values of the collector current *i*17 of the transistor Q21 (the currents flowing through the resistors R11 and R12 are respectively *i*17/2) and the collector current *i*17 of the transistor Q20 as the above described state is maintained unchanged. Therefore, it is possible to vary also the value of the collector current *i*16 (*i*17/2) of the transistor Q16 and also the value of the current *i*1 (= *i*16 + *i*18).

Accordingly, by adjusting the resistance value of the variable resistor R15, the current *i*18 can be varied, and the oscillation frequency can be adjusted in accordance with this current i18 as the above mentioned state of *i*15 = *i*16 = *i*17/2 is maintained.

When, after the variable resistor R15 has been adjusted in this manner, an external control signal is applied across the terminals *ta* and *tb*, the collector current *i*16 of the transistor Q16 can be varied from zero to *i*17 with the potential difference between the junction points A1 and A2 held constant.

Consequently, the current *i*1 varies in a range of from *i*18 to (~*i*18 + *i*17) about a current value of (*i*18 + *i*17/2) as a center. For this reason, by causing the current *i*1 = *i*18 + *i*17/2 after adjustment to correspond to the oscillation center frequency *f*0 and the current *i*17/2 to correspond to the frequency *f*1, a PLL lock range characteristic which is symmetrical about a frequency *f*0 of a width (*f*0 + *f*1) as a center can be obtained.

Therefore, in the circuit of the instant embodiment, the oscillation center frequency of the voltage controlled oscillator can be adjusted at will, and even when this frequency is varied, the lock range characteristic of a PLL in which this voltage controlled oscillator is used is continually maintained in a symmetrical state.

While, in the present disclosure, terms such as "voltage controlled oscillator", and "voltage controlled oscillator circuit part" are used, they are intended to cover and include terms such as "current controlled oscillator" and "current controlled oscillator circuit part" thus expressed in view of the point that oscillation frequencies therein are controlled by currents.

Further, this invention is not limited to these embodiments but various vatiations and modifications may be made without departing from the scope and spirit of the invention.

What is claimed is:

1. A circuit arrangement of voltage controlled oscillator comprising: a voltage controlled oscillator circuit part for generating a signal of a frequency proportional to an input control current; a first constant-current circuit for causing a predetermined constant current to flow; current dividing means for dividing said constant current of the first constant-current circuit in accordance with a control voltage applied from the outside; and a second constant-current circuit for causing a predetermined constant current to flow, the oscillation frequency of said voltage controlled oscillation circuit part being controlled by said input control current equal to the sum of one divided current divided by said current dividing means and the constant current of said second constant-current circuit.

2. A circuit arrangement of a voltage controlled oscillator as claimed in claim 1 in which said current dividing means comprises a differential amplifier including a pair of transistors on whose respective bases control voltages are applied.

3. A circuit arrangement of a voltage controlled oscillator as claimed in claim 1 in which said current dividing means divides an output current I1 of said first constant-current circuit within a range of from zero to I1, and the input of said voltage controlled oscillator circuit part is varied within a range of ±½ I1 about (I2 +½ I1) as a center (where I2 is an output current of the second constant-current circuit).

4. A circuit arrangement of a voltage controlled oscillator as claimed in claim 1 in which said voltage controlled oscillator circuit part comprises: a pair of transistors having respective emitters connected together and receiving said input control current passed therethrough, said transistors alternately repeating ON and OFF operations; means operating in accordance with said ON and OFF operations of said transistors to vary the base potential of one of said transistors between two mutually different potentials; a resistor of high resistance value connected to the base of said one of said transistors, the other of said transistors being connected to a capacitor for repeatedly charging and discharging with respect to the base of said other transistor; and means for causing charging and discharging currents of currents of current values equal to the current value of driving means to flow in said capacitor.

5. A circuit arrangement of a voltage controlled oscillator as claimed in claim 4 in which: said circuit arrangement is incorporated within a single integrated circuit; said capacitor is outside of said integrated circuit; and the integrated circuit has a terminal for connecting the capacitor to the base of said other of the transistors.

6. A circuit arrangement of a voltage controlled oscillator as claimed in claim 1 in which said first contant-current circuit comprises a current mirror circuit for flowing equal currents respectively through two output ends thereof, one of said output ends being connected to said current dividing means, and there is further provided with a pair of control terminals on which the control voltage from the outside is applied, said control terminals, in a state wherein the potentials thereof are maintained substantially equal, being connected to means for varying the current of the other of said output ends of current mirror circuits.

7. A circuit arrangement of a voltage controlled oscillator as claimed in claim 6 in which said current mirror circuit comprises a first transistor of which collector is connected to said current dividing means and a second transistor of which collector is connected by way of two resistors respectively to said pair of control terminals and, moreover, is connected to the bases of the first and second transistors.

* * * * *